US007903007B2

(12) United States Patent
Le Men et al.

(10) Patent No.: US 7,903,007 B2
(45) Date of Patent: Mar. 8, 2011

(54) METHOD AND APPARATUS FOR CONVERTING SIGNALS

(75) Inventors: Berengere Le Men, Tournefeuille (FR); Ludovic Oddoart, Frouzins (FR); Cor Voorwinden, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/528,819

(22) PCT Filed: Mar. 21, 2007

(86) PCT No.: PCT/IB2007/051437
§ 371 (c)(1),
(2), (4) Date: Aug. 27, 2009

(87) PCT Pub. No.: WO2008/114101
PCT Pub. Date: Sep. 25, 2008

(65) Prior Publication Data
US 2010/0013687 A1 Jan. 21, 2010

(51) Int. Cl.
*H03M 1/00* (2006.01)
(52) U.S. Cl. .......... 341/141; 341/142; 341/143; 341/144
(58) Field of Classification Search .................. 341/141, 341/142, 143, 144
See application file for complete search history.

(56) References Cited

U.S. PATENT DOCUMENTS

| | | | | |
|---|---|---|---|---|
| 4,430,642 | A * | 2/1984 | Weigand et al. | 341/141 |
| 4,591,832 | A * | 5/1986 | Fling et al. | 341/141 |
| 5,661,811 | A * | 8/1997 | Huemann et al. | 381/309 |
| 6,052,655 | A * | 4/2000 | Kobayashi et al. | 702/184 |
| 6,246,279 | B1 * | 6/2001 | Komuro | 327/361 |
| 6,473,013 | B1 * | 10/2002 | Velazquez et al. | 341/120 |
| 6,492,903 | B1 * | 12/2002 | Ranon | 340/521 |
| 6,714,796 | B1 * | 3/2004 | Mizukoshi et al. | 455/550.1 |
| 6,714,825 | B1 | 3/2004 | Tanaka | |
| 6,825,785 | B1 * | 11/2004 | Huang et al. | 341/141 |
| 7,340,070 | B2 * | 3/2008 | Nakata | 381/110 |
| 7,405,684 | B2 * | 7/2008 | Kimura et al. | 341/141 |
| 7,436,335 | B2 * | 10/2008 | Lee et al. | 341/141 |
| 7,504,979 | B1 * | 3/2009 | Knausz et al. | 341/154 |

OTHER PUBLICATIONS

Wolfson Microelectronics PLC: "WM8750L-Stereo Codec for Portable Audio Applications—Production Data, Oct. 2006, Rev. 4.3" pp. 1,31.
Wolfson Microelectronics PLC: "WM8955L-Stereo DAC for Portable Audio Applications—Production Data, Mar. 2006. Rev. 4.2" pp. 1,20.
International Search Report and Written Opinion correlating to PCT/IB2007/051437 dated Feb. 16, 2009.

* cited by examiner

*Primary Examiner* — Linh V Nguyen

(57) ABSTRACT

A method of converting a plurality of input signals on first and second converters, such that the first and second converters are both used when the plurality of signals comprises two signals, characterised in that said method comprises:

selecting more than two input signals;

determining the type of each selected signal;

combining any signals having the same type to form a combined signal;

converting one type of signal with the first converter;

converting a second type of signal with the second converter wherein the first or second type signals is a combined signal.

20 Claims, 6 Drawing Sheets

METHOD AND APPARATUS FOR CONVERTING SIGNALS

FIELD OF THE INVENTION

This invention relates to a method and an apparatus to improve the digital-to-analog conversion of multi-channel audio signals with different input sample rates, particularly but not exclusively in a cellular phone.

BACKGROUND OF THE INVENTION

With the constant technology improvements, cellular phones comprise many different functions in addition to the common phone function. Thus a user can use his cellular phone to process different functions. For instance, a user can use his phone to take and store pictures, to make and store a video film, to send a text message to another cellular phone, to download mages or music files from an outside device, to register events in a calendar, to listen to mp3 files already downloaded on the memory of the cellular phone from an external device, to listen to the radio, to play to electronic games, etc. In addition, many of these other functions which are supported on a telephone may themselves have devices which support telephone communication. All of these functions are available because the cell phone or other devices comprise many electronic circuits and components that manage these functions.

The different functions of the cellular phone relate to different kinds of data content for example video data, text data or audio data. The transfer of these kinds of data from an outside device to the memory of the cell phone or from the memory of the cell phone to the user occurs through signals carrying the data so the data can be visualized, read or heard. For instance an audio signal carries audio data. A digital signal or an analog signal can represent such an audio signal. Similarly other devices support these and other types of signal.

When a user wants to listen to an mp3 file, the digital audio signal or music signal related to mp3 file data stored in a device such a cellular phone must be transformed or a conversion made before the user can hear the data as an analog audio signal. In fact the data are stored in a digital format and the conversion allows transformation of the said audio signal into an analog signal. Thus the user can hear the signal.

The same conversion occurs when a user receives a phone call from another person. The conversion will convert the digital audio signal coming from another cell phone as soon as this signal reaches the receiving cell phone. In fact the incoming signal is again a digital signal and the user can only hear an analog signal. So the conversion will transform the said digital signal into an analog one.

For both situations, mp3 listening and voice call listening, the conversion of corresponding digital audio signal occurs through an electronic component such as a digital to analog converter (DAC). A digital audio signal having an mp3 source is defined by a wide frequency bandwidth as a wide band signal. A digital audio signal having a voice source is defined by a narrow frequency bandwidth as a narrow band signal. Both these digital audio signals are also defined by their input sample rate or their sampling frequency. The input sample rate of a digital audio signal is typically two times its frequency bandwidth as defined by the Shannon Whittaker sampling theorem for example. A narrow band signal such as a voice signal has a relatively low input sample rate (below about 16 kHz). A wide band signal such as a music signal has a relatively high input sample rate (about 44.1 kHz for standard mp3 files). The electronic circuit of a mobile phone comprises different DACs in order to process such conversions for different kind of data. Sometimes the user may be listening to an mp3 file and then receives a phone call. In this situation, three DACs will realize the conversion from digital signal to analog signal. As the wide band signal representing the music signal is generally a stereo signal, the conversion into a corresponding analog signal uses two DACs. The narrow band telephone call signal uses one DAC. Moreover, one type of DAC is required for wide band signal and another type of DAC is required for narrow band signal.

Therefore this kind of process generates an important current consumption due to the amount of circuitry and the constant battle with expanding battery life. Besides time for developing and manufacturing, the process needs two different kinds of DACs. So the whole system of the cell phone including the different kinds of DACS takes much more time than would otherwise be the case.

FIG. 1 shows a prior art schematic structure of a circuit 100 for a mobile phone. This circuit 100 processes the conversion of digital audio signals into analog audio signals. This circuit comprises three inputs for three signals. Each signal comprises an amplitude which determines the instantaneous intensity or the average intensity of the signal. Each signal also comprises its own frequency which is different from the sampling frequency. Each signal comprises bits that are serial bits. The input 102 relates to a narrow band digital audio signal 104 such as voice signals with a given, usually low, input sample rate. This voice signal 104 relates to a phone call which the user receives on a mobile phone. A voice signal usually comprises a 13-bits or 14-bits coded structure. This means that all 13-bits or 14-bits belong to one signal. The inputs 106 and 108 relate to wide band audio signals 110 and 112. The sample rate of these signals 110 and 112 differ from the sample rate of the signal 104. These wide band signals represent a music signal. The combination of these two signals 110 and 112 provides a stereo music signal. A music signal usually comprises a 16-bits (or more) coded structure. This means that 16 bits belong to one signal. A music signal relates for instance to a signal corresponding to an mp3 file already registered on storage means of the mobile phone for instance. In the prior art situations, connection lines 114, 116 and 118 are dedicated for each of the three signals 104, 110 and 112. The connection lines each comprise one serial parallel interface or interface module 120 and one digital analog converter (DAC) 122. The interface 120 transforms all the serial bits into parallel bits. Concerning the voice signal 104, the interface module 120 transforms the 13-bits or 14-bits signal 104 into 13 signals or 14 signals with a 1-bit coded structure. In the same way, concerning the music signals 110 and 112, the interface module 120 transforms the 16-bits coded structure into 16 signals with a 1-bit coded structure. This digital analog converter allows the conversion of a digital signal to a corresponding analog signal. The DAC 122 comprises a digital filter 124, a sigma delta modulator 126, a D-to-A filter 128 and a smoothing filter.

In the prior art, U.S. Pat. No. 6,714,825 describes a multi-channel reproducing method in order to convert multi-channel audio sources having different sample rates. This method employs less DACs than the number of incoming channels. However this method requires a specific sampling rate conversion in order to convert all the different signals to obtain the same bandwidth for all the signals. Also this process increases the digital complexity of the circuit.

It appears that if a user wants to listen simultaneously to voice call signals and music signals on a device such as a mobile phone, solutions exist but they necessitate a costly hardware implementation as described above. A number of different methods have been proposed to overcome the problem of reducing the number of DAC in a mobile device but these solutions are not very efficient.

An object of the present invention is to provide a method and an apparatus which overcome at least some of the problems associated with the prior art.

SUMMARY OF THE INVENTION

According to one aspect of the present invention there is provided a method and an apparatus as defined in the appended claims.

One of the advantages of the solution is to reduce the number of DACs to process signals without necessitating any additional complex process for these signals.

BRIEF DESCRIPTION OF THE DRAWINGS

Reference will now be made, by way of example, to the accompanying drawings, in which.

DETAILED DESCRIPTION OF THE PREFERRED EMBODIMENTS

Figure 1:
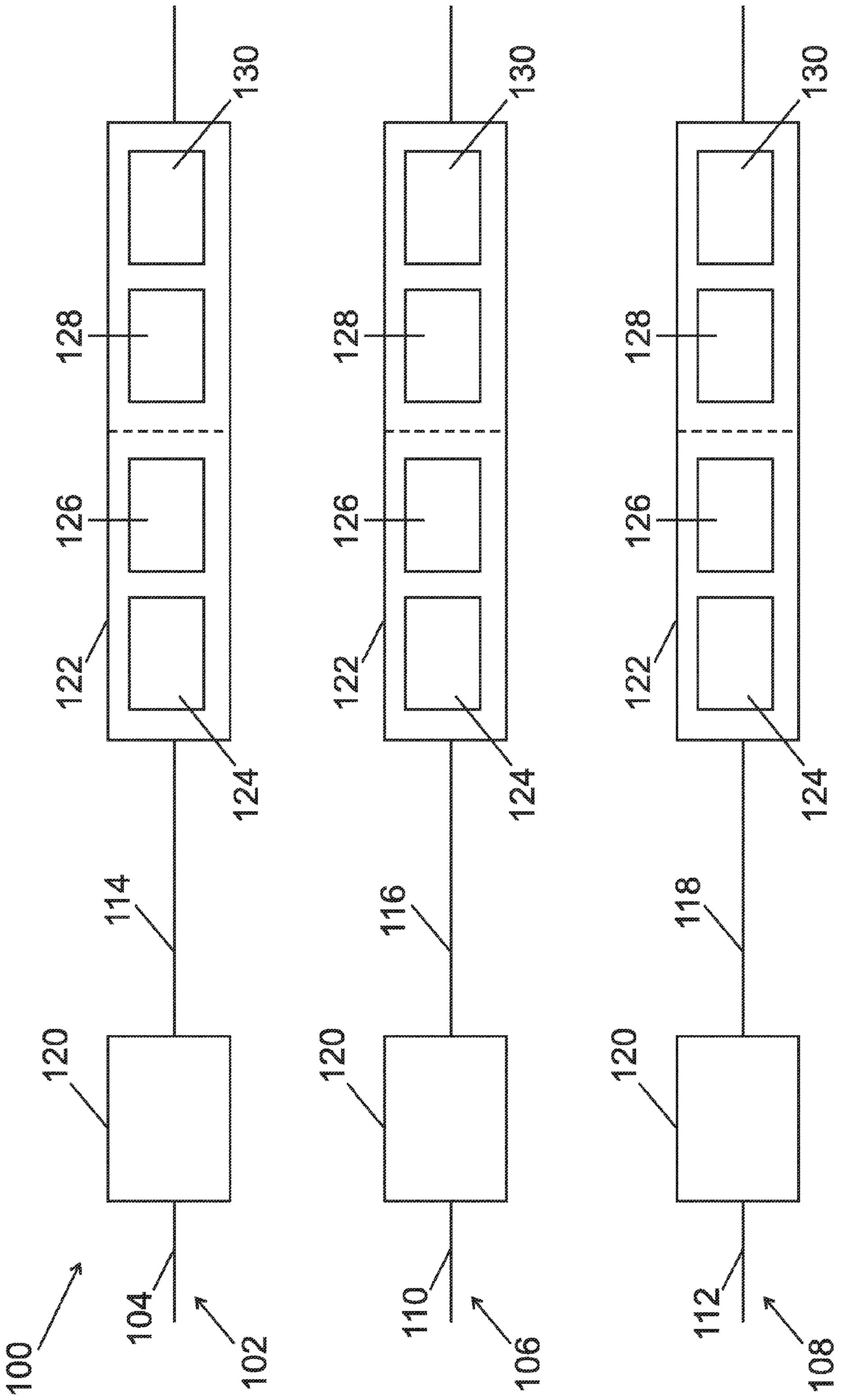
FIG. 1 shows a schematic architecture of a prior art with three DACs
Figure 2:
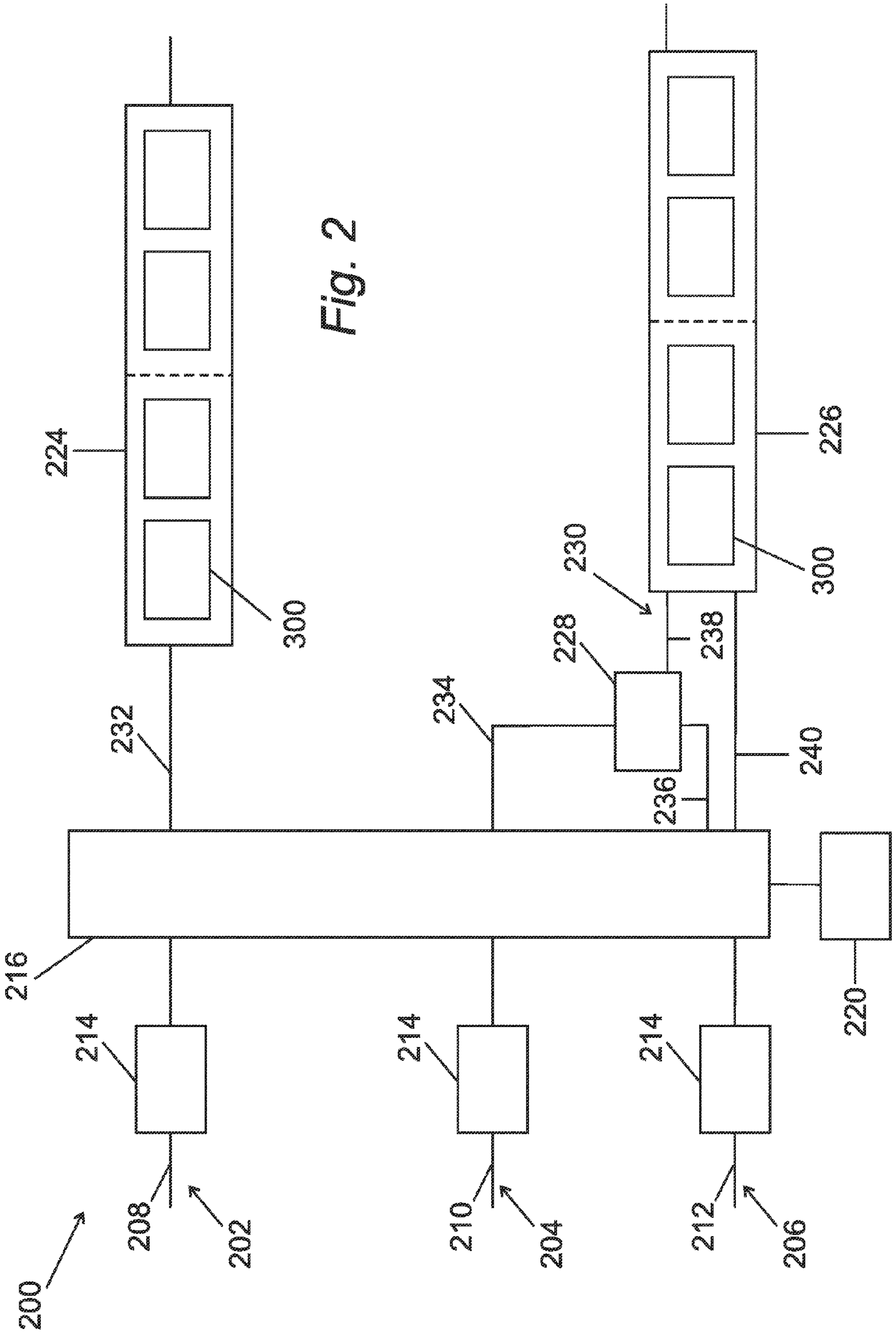
FIG. 2 shows a schematic architecture in accordance with one embodiment of the invention, given by way of example.

FIG. 2 shows a circuit which relates to the present invention. As described in prior art the circuit 200 comprises three inputs 202, 204 and 206 for three signals 208, 210 and 212. The signal 208 may be an audio digital signal with a first type of sample rate such as a voice signal. The sample rate of such a signal is usually low. The signal 208 is a narrow band signal. This voice signal 208 relates to a phone call which the user receives on a mobile phone. A voice signal usually comprises a 13-bits or 14-bits coded structure. The signals 210 and 212 may be other audio digital signal with a second type of sample rate such as a music signal. The sample rate for this music signal is usually higher than a voice signal. The signals 210 and 212 are wide band signals. The combination of these two signals 210 and 212 represent a stereo music signal. These wide band signals 210 and 212 represent a music signal. A music signal usually comprises a 16-bits (or more) coded structure. This means that 16 bits belong to one signal. A music signal relates for instance to a signal corresponding to an mp3 file already registered on storage means of the mobile phone for instance. The circuit 200 also comprises three corresponding serial parallel interface or interface module 214 for each signal. Differing with the prior art, a multiplexing module 216 is located after the interface modules 214. The multiplexing module 216 receives each signal coming either from interface modules 214 related to the first input 202 or related to the second and third input 204 and 206 or to all entries 202, 204 and 206 in order to pass them to further digital analog converters 224 and 226. A SPI (Serial Parallel Interface) bus register module 220 passes specific information to the multiplexing module 216. The SPI bus register module is a module which may be programmed in advance during the phone operation. This SPI bus register module 220 carries out selecting functions and determining functions in order to send specific information to the multiplexing module 216. This specific information relates to the number of the input signals. The SPI bus register module 220 generates a number equal to one if there is only signal 208 as an input signal, a number equal to two if there are both input signals 210 and 212; and a number equal to three if there are input signals 208, 210 and 212. The SPI bus register module 220 also transmits information relating to the type of the input signals i.e. voice type or music type. The SPI bus register module 220 detects the sample rate of each input signal 208, 210 or 212. Thus knowing these both pieces of information concerning the number of the signals and the type of the signals, the multiplexing module 216 is able to pass one or more input signals on one or more corresponding connection lines. Then the multiplexing module 216 determines to which digital analog converters 224 and 226 to send the audio digital signals 208, 210, 212 using the connection lines 232, 234, 236, 240.

Also differing from the prior art, the circuit 200 comprises a combining module 228. This combining module allows combining both audio digital stereo signals 210 and 212 into an audio digital mono signal 230. This combining module 228 comprises a first function to add the instantaneous amplitudes of signal 210 and signal 212 and a second function to divide by two the total resulting amplitude in order to avoid an overflow of the component 300 which comprises a digital filter. This overflow relates to a hardware limitation of such a component. The combination of both functions addition and division provides a stereo to mono function. This means that the stereo input signal becomes a mono signal after the combination process.

From the multiplexing module 216 to the digital analog converters 224 and 226, the circuit 200 comprises different connection lines. Connection line 232 connects the multiplexing module 216 and the digital analog converter 224. Connection line 232 refers to the conversion line for the voice signal 208 and also for one of the two stereo signals 210 and 212 as signal 210 for instance. Connection line 234 connects the multiplexing module 216 and the combining module 228. Connection line 234 refers to the connection line for one of the two stereo signals 210 and 212 as signal 210 for instance. Connection line 236 also connects the multiplexing module 216 and the combining module 228. Connection line 236 refers to the conversion line for the other of the two stereo signals 210 and 212 as signal 212 for instance. Connection line 238 connects the combining module 228 to the digital to audio converter 226 and refers to the conversion line for the audio combined mono signal 230. Connection line 240 connects the multiplexing module 216 to the digital to audio converter 226 and refers to the other of the two stereo signals 210 and 212 as for instance signal 212.

The use of these different connection lines depends on the number and type of input signals the SPI bus register module 220 sends to the multiplexing module 216. This will now be explained in more detail.

Figure 3:
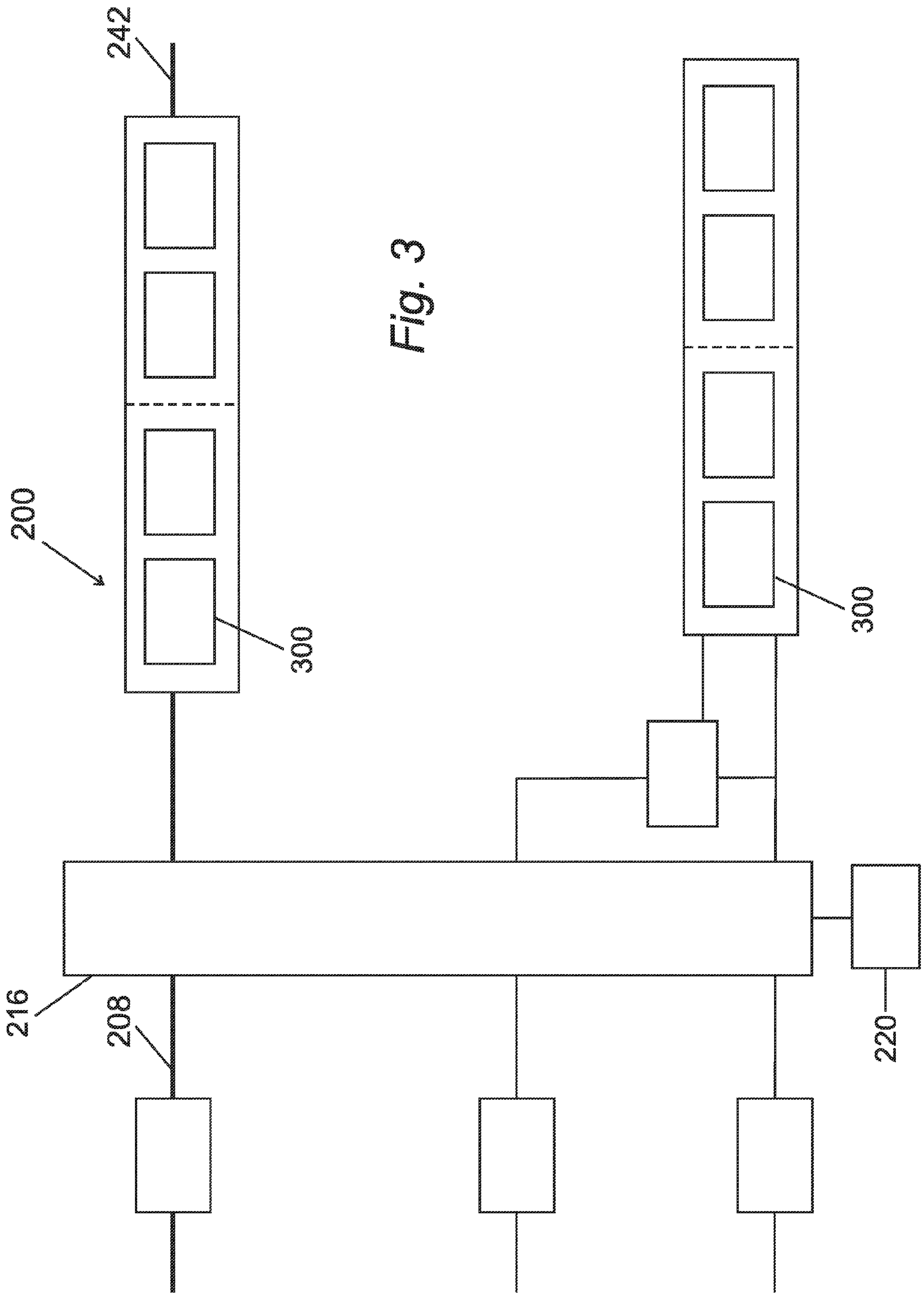
FIG. 3 shows a schematic architecture with two DACs for playing the playback of mono voice band stream in accordance with one embodiment of the invention, given by way of example.

Three situations may occur in the circuit 200. As described in FIG. 3, the circuit 200 only processes a mono voice signal 208 to the multiplexing module 216. Therefore the SPI register module 220 sets the number of digital audio input signals register to one referring to signal 208. In the same way the SPI register module 200 sets the type of bandwidth to narrow band as the signal 208 is a voice signal. Thus the multiplexing module 216 transmits the signal 208 to the digital analog converter 224 through the connection line 232. In this situation there is one resulting analog signal 242 representing analog voice signal.

Figure 4:
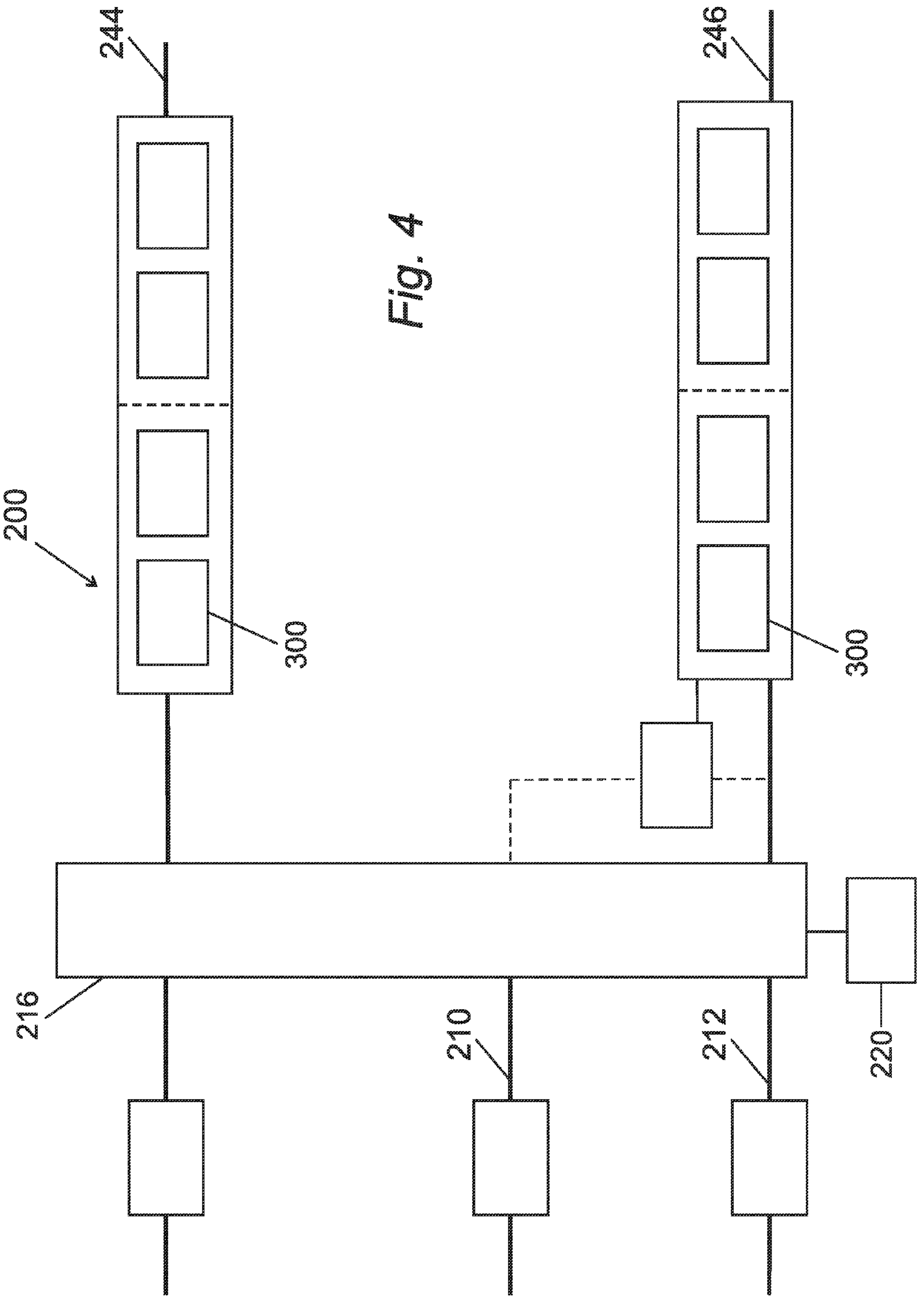
FIG. 4 shows a schematic architecture with two DACs for playing the playback of stereo wide band stream in accordance with one embodiment of the invention, given by way of example.

As described in FIG. 4, another situation may occur where the circuit 200 only processes stereo signals 210 and 212 to the multiplexing module 216. Therefore the SPI register module 220 sets the number of digital audio input signals to two referring to signal 210 and 212. In the same way, the SPI register module 220 sets the type of bandwidth to wide band as both signals relate to a music signal. As the SPI register module 220 does not select any other signal, the multiplexing module 216 determines that the connection line 232 is available. Thus the multiplexing module 216 transmits signal 210 i.e. one of the two stereo signals to the digital analog converter 224 through the connection line 232. The multiplexing module 216 sends the other stereo signal 212 to the digital to audio converter 226 through the connection line 240. In this situation there are two resulting signals 244 and 246 representing analog stereo music signals.

Figure 5:
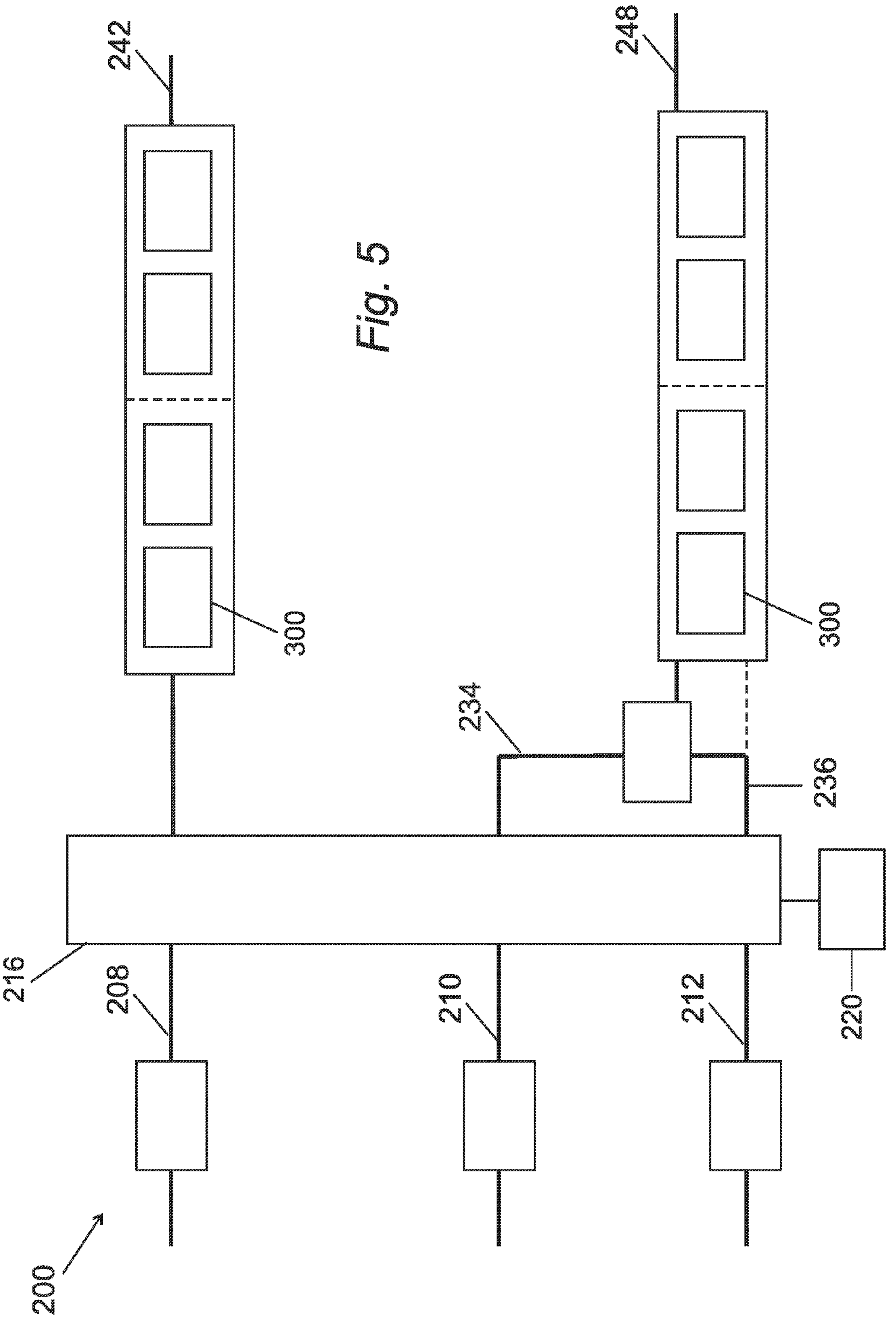
FIG. 5 shows a schematic architecture for simultaneously playing voice band and wide band streams in accordance with one embodiment of the invention, given by way of example.

As described in FIG. 5, another situation may occur where the circuit 200 processes three signals 208, 210 and 212 to the multiplexing module 216. Therefore the SPI register module 220 sets the number of digital audio input signals to three referring to signal 208, 210 and 212. In this situation, the SPI register module 220 selects different types of bandwidth. The signal 208 has a narrow bandwidth and signals 210 and 212 have a wide bandwidth. In order to convert simultaneously the three different signals, the multiplexing module 216 transmits in a different way all these three signals. The multiplexing module 216 transmits the voice signal 208 to the digital audio converter 224 through connection line 232. Simultaneously the multiplexing module transmits the first stereo signal 210 to the combining module 228 through the connection line 234 and the second stereo signal 212 to the combining module 228 through the connection line 236. The combining module 228 processes both signals 210 and 212 to provide a mono signal 230. This mono signal uses connection line 238 to reach digital audio converter 226. In this situation there are two resulting signals, 242 and 248. The signal 242 represents the analog mono voice signal and the signal 248 represents the analog mono music signal resulting from the digital stereo-to-mono conversion of the signals 210 and 212.

Figure 6:
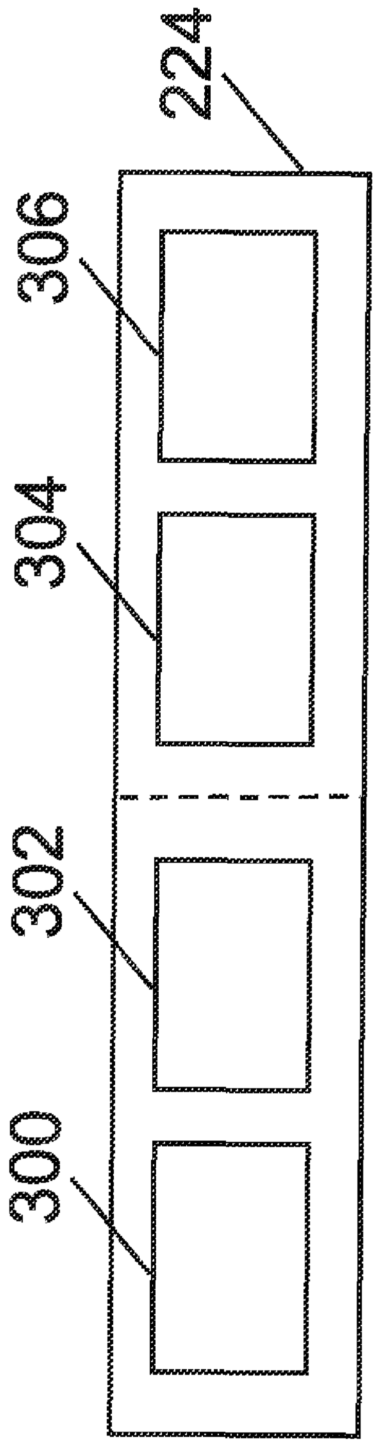
FIG. 6 shows a schematic diagram of a digital analog converter in accordance with one embodiment of the invention, given by way of example.

Digital analog converters 224 and 226 comprise the same elements. These elements are detailed on FIG. 6 for DAC 224. The same description is valid for DAC 226. In FIG. 6, DAC 224 comprises a digital filter 300, a sigma delta modulator 302, a D-to-A filter 304 and smoothing filter 306. The components 300 and 302 process a digital transformation of the signal to be converted. The components 304 and 306 process an analog transformation of the signal. According to situations described in FIG. 3 and in FIG. 5, the different components of the DAC 224 have to be adaptive in order to manage and process both voice signal 208 and music signal 210 according to one of the three above mentioned situations that may occur in the whole circuit 200. In case of a narrow band signal processing, the different components of the DAC 224 are adapted in order to minimize the power consumption. In case of a wide band signal processing, the different components of the DAC 224 are adapted in order to maximize the audio performances defined as signal-to-noise ratio and total harmonic distortion.

The process of the combining module 228 as shown in FIG. 5 will now be described. In the situation described for FIG. 5, three signals enter the circuit 200. The multiplexing module 216 receives these threes signals and then as described above in the description it transmits two digital stereo signals having the same sample rate to the combining module 228. This combining module 228 processes two transforming functions on the two signals 210 and 212. The first function is to add both instantaneous amplitudes of the two signals to obtain resulting amplitude. The second function is to divide by two the resulting amplitude. So the amplitude of the resulting signal 230 is an average amplitude from the two signals 210 and 212. The second function is mandatory to avoid an overflow of the digital filters 300 when both signals 210 and 212 have a full scale amplitude. Additionally the signal 230 is now a mono digital signal.

It will be appreciated the examples described above are just that. Other alternatives may exist which fall within the scope of the present invention.

In particular it will be appreciated that this invention can be implemented in software. Also the invention can be adapted to occur with any number of input signals, with the objective of reducing the number of converters, to be less than the number of input signals.

The invention claimed is:

1. A method of converting a plurality of input signals on first and second converters, such that the first and second converters are both used when the plurality of signals comprises at least two signals, said method comprises:

selecting more than two input signals when the plurality of signals comprises more than two signals;

determining the type of each selected signal;

combining any signals having the same type to form a combined signal;

converting signals of a first type with the first converter;

converting signals of a second type with the second converter wherein the first or second type signals is a combined signal;

wherein the step of determining the type of each selected signal comprises determining the input sample rate and/or the bandwidth of each selected signal.

2. The method of claim 1, wherein the step of selecting more than two signals comprises selecting three signals.

3. The method of claim 1, wherein combining any signals having the same type comprises carrying out an addition function.

4. The method of claim 1, wherein combining any signals having the same type comprises carrying out a division function.

5. Apparatus for converting a plurality of signals on first and second converters, such that the first and second converters are both used when the plurality of signals comprises at least two signals, said apparatus comprises:

a selector for detecting if there are more than two signals and for determining the type of each selected signal;

a combining module for combining any signals having the same type to form a combined signal;

wherein the first converter converts signals of a first type and the second converter converts a of signals of a second type, and wherein the first or second type signals is a combined signal, and wherein determining the type of each selected signal comprises determining the input sample rate and/or the bandwidth of each selected signal.

6. The apparatus of claim 5, wherein the plurality of signals comprises digital audio signals.

7. The apparatus of claim 5, wherein the type of signals comprises the bandwidths of signals.

8. The apparatus of claim 5, wherein the type of signals comprises the input sample rate of signals.

9. The apparatus of claim 5, wherein the first and second converters comprise first and second digital analog converters.

10. A computer program stored on a computer readable medium having embodied thereon computer comprising instructions that when executed by processing circuitry perform the steps comprising:

selecting more than two input signals when the plurality of signals comprises more than two signals;

determining the type of each selected signal;

combining any signals having the same type to form a combined signal;

converting signals of a first type with the first converter;

converting signals of a second type with the second converter wherein the first or second type signals is a combined signal;

wherein the step of determining the type of each selected signal comprises determining the input sample rate and/or the bandwidth of each selected signal.

11. The method of claim 2, wherein combining any signals having the same type comprises carrying out an addition function.

12. The method of claim 2, wherein combining any signals having the same type comprises carrying out a division function.

13. The method of claim 3, wherein combining any signals having the same type comprises carrying out a division function.

14. The apparatus of claim 6, wherein the type of signals comprises the bandwidths of signals.

15. The apparatus of claim 6, wherein the type of signals comprises the input sample rate of signals.

16. The apparatus of claim 7, wherein the type of signals comprises the input sample rate of signals.

17. The apparatus of claim 6, wherein the first and second converters comprise first and second digital analog converters.

18. The apparatus of claim 7, wherein the first and second converters comprise first and second digital analog converters.

19. The apparatus of claim 8, wherein the first and second converters comprise first and second digital analog converters.

20. The computer program of claim 2, wherein the steps further comprise combining any signals having the same type comprises carrying out an addition function.

* * * * *